(12) United States Patent
Ermishin et al.

(10) Patent No.: US 10,268,659 B2
(45) Date of Patent: Apr. 23, 2019

(54) METHOD OF CONDUCTING MEASUREMENTS AND ANALOG-DIGITAL SYSTEM FOR ITS IMPLEMENTATION

(71) Applicant: OBSHCHESTVO SOGRANICHENNOY OTVETSTVENNOSTYU "ALTHAVEN TECHNOLOGY", Minsk (BY)

(72) Inventors: Sergey Ermishin, Moscow (RU); Alexandra Korol, Moscow (RU)

(73) Assignee: OOO "Althaven Technology", Minsk (BY)

( * ) Notice: Subject to any disclaimer, the term of this patent is extended or adjusted under 35 U.S.C. 154(b) by 148 days.

(21) Appl. No.: 15/021,937

(22) PCT Filed: Sep. 13, 2013

(86) PCT No.: PCT/BY2013/000008
§ 371 (c)(1),
(2) Date: Mar. 14, 2016

(87) PCT Pub. No.: WO2015/035491
PCT Pub. Date: Mar. 19, 2015

(65) Prior Publication Data
US 2016/0259759 A1   Sep. 8, 2016

(51) Int. Cl.
| | | |
|---|---|---|
| G06F 17/00 | (2006.01) | |
| G06F 17/18 | (2006.01) | |
| G06F 17/10 | (2006.01) | |
| G01D 5/00 | (2006.01) | |
| H03M 1/10 | (2006.01) | |
| H03M 1/12 | (2006.01) | |

(52) U.S. Cl.
CPC ............... *G06F 17/18* (2013.01); *G01D 5/00* (2013.01); *G06F 17/10* (2013.01); *H03M 1/1071* (2013.01); *H03M 1/12* (2013.01)

(58) Field of Classification Search
None
See application file for complete search history.

(56) References Cited

U.S. PATENT DOCUMENTS

| | | | | |
|---|---|---|---|---|
| 4,250,552 A * | 2/1981 | Elms | ..................... | G01R 21/133 324/142 |
| 4,257,004 A * | 3/1981 | Miller | .................. | G01R 21/133 324/141 |
| 4,282,576 A * | 8/1981 | Elms | ..................... | G01R 21/133 324/142 |

(Continued)

*Primary Examiner* — Evren Seven
(74) *Attorney, Agent, or Firm* — Inventa Capital PLC (57) ABSTRACT

A method of conducting measurements of a physical quantity comprising registration by two measurement instruments the value of one and the same physical quantity in the form of analog signals, converting these signals into digital form, mathematical processing of the results and subsequent conversion of digital signals into analog. Analog-digital system for conducting measurements of a physical quantity (quantum transducer or quantum converter) comprising two measurement instruments, at least one analog-digital signal transducer, a computing instrument and at least one digital-analog transducer, at that the device for performing computations is executed in the form of four functional blocks.

2 Claims, 2 Drawing Sheets

(56) References Cited

U.S. PATENT DOCUMENTS

| | | | | |
|---|---|---|---|---|
| 4,388,611 A | * | 6/1983 | Haferd | G01R 21/133 |
| | | | | 327/78 |
| 4,728,886 A | * | 3/1988 | Petr | H03K 7/06 |
| | | | | 324/120 |
| 4,742,296 A | * | 5/1988 | Petr | G01R 21/08 |
| | | | | 324/142 |
| 4,783,748 A | * | 11/1988 | Swarztrauber | G01R 21/133 |
| | | | | 324/142 |
| 4,924,412 A | * | 5/1990 | Leydier | G01R 21/133 |
| | | | | 324/142 |
| 4,972,141 A | * | 11/1990 | Rozman | G01R 21/08 |
| | | | | 324/117 H |
| 5,194,850 A | * | 3/1993 | Bourrieres | G01R 21/133 |
| | | | | 324/127 |

\* cited by examiner

METHOD OF CONDUCTING MEASUREMENTS AND ANALOG-DIGITAL SYSTEM FOR ITS IMPLEMENTATION

RELATED APPLICATIONS

This application claims priority to International Application No. PCT/BY2013/000008, filed on Sep. 13, 2013, and incorporated herewith by reference in its entirety.

BACKGROUND OF INVENTION

The stated method of measurements and analog-digital system for its implementation apply to metrology, namely to digital measurements of various parameters types (voltage, current, resistance, pressure, temperature, frequency, time, etc.) that are combined with mathematical processing of the results. The stated technical solutions are combined in a single inventive concept and can be used in various technical fields.

A method of measurements of electrical and non-electrical parameters is known [1]. The method is based on conducting measurements using two transducers, the static characteristics of which are represented in the form of linearly independent functions. Each transducer conducts the measurement of the parameter being tested with an uncontrolled parameter. Carry out the calibration of coefficients of static characteristics of the transducers by measuring the values of three references, homogeneous with the test parameter. Values of the reference are being used, homogeneous with the uncontrolled parameter, and compute the value of the test parameter, ensuring the independence of the measurement result from the values of the uncontrolled parameter and the mentioned coefficients.

However, this method has low accuracy due to lack of precision of perception of the relationship between the measured values and the true values of the quantity. Furthermore, the method is quite laborious and difficult in application due to the fact that it requires data about the true values of the parameter (reference) with the reference standard.

The closest analog (prototype) of the proposed inventions group is a method of measuring parameters of television broadcast signals and analog-digital system for the implementation of the method [2].

The known method includes the fixation of the television signals, their analog-digital conversion, an intermediate storage of the measurement results, their mathematical processing on a personal computer in relation to the specified informative-indicative model and the conversion of the measurement results into analog form.

The disadvantageous feature of this method is the relatively low accuracy and narrow applicability, due to the fact that it is designed for measuring and processing only television signals, in addition to the above stated actions, it requires the additional performance of a number of specific operations.

The known analog-digital system for the implementation of the method of measuring the parameters of television broadcasting signals contains an input device, an analog-digital transducer, a PC and a program block. The complex provides an opportunity to expanded configuration designated for displaying measured values on the display screen and restoring of the analog form of the measured signal by means of a digital-analog transducer.

Analog-digital system and the method for the implementation of which its serves, is insufficiently universal. Its use for conducting measurements of the physical quantity other than the television signals, requires its significant redesigned and modernization. In fact, in each case, for each specific measurement of the physical quantity requires a radical re-equipment of the system, which is equivalent to creating a new one.

The task, for the solution of which the stated invention group is intended, is to increase the accuracy of measurements.

SUMMARY OF THE INVENTION

The problem is solved by method of conducting measurements of the physical quantity, including the registry by two measurement instruments the value of one and the same physical quantity in the form of analog signals, converting these signals into digital form, mathematical processing of the results and subsequent conversion of digital signals into analog signals. In the process for each of the results obtained by each of the two measurement instruments, an uncertainty rate is set, together with the results it represents the source data in digital form for mathematical processing, whereby the mathematical processing is performed by converting the source data into coefficients analogues and the unknowns in Pauli quantum equation with the spinor component of the Stern-Gerlach experiment, solutions of these equations and computing the analogues of the spin number and the corresponding probabilities which are then converted to the desired, corrected measurement result of the physical quantity.

I.e., the value of the measured quantity, simultaneously obtained by two measurement instruments, by means of mathematical processing is converted into a form that is less dependent on the influence of quantities that are associated with both the manifestations of random effects, as well as with the inaccuracy of the amendments to the results to the systematic errors, and then convert back to the measured source value but more precise.

The solution to this problem is also provided by the analog-digital system for measuring the physical quantity, comprising of two measurement instruments, at least one analog-digital transducer, at least one digital-analog transducer, and a computing instrument, which is executed in the form of four functional blocks. The outputs of the first and second measurement instrument are connected to the inputs of the transducer converting analog signal into digital form. The outputs of the transducer converting analog signal into digital form are connected to the inputs of the first functional block designed to convert source data into coefficient analogues and unknowns in the Pauli quantum equation with the spinor component of the Stern-Gerlach experiment, solutions of these equations and computing the analogues of the spin number and its corresponding probability. The outputs of the first block are connected to the inputs of the second and third block, designed to indicate on the reference scales analogues of the spin number and its probability respectively. The outputs of the second and third block are connected to the input of the fourth block, for converting the analogues of the spin number and its corresponding probability into the desired, corrected measurement result of a physical quantity, and the output of the fourth block is connected to the input of the digital-analog transducer.

DETAILED DESCRIPTION OF THE PREFERRED EMBODIMENT OF THE INVENTION

Figure 1:
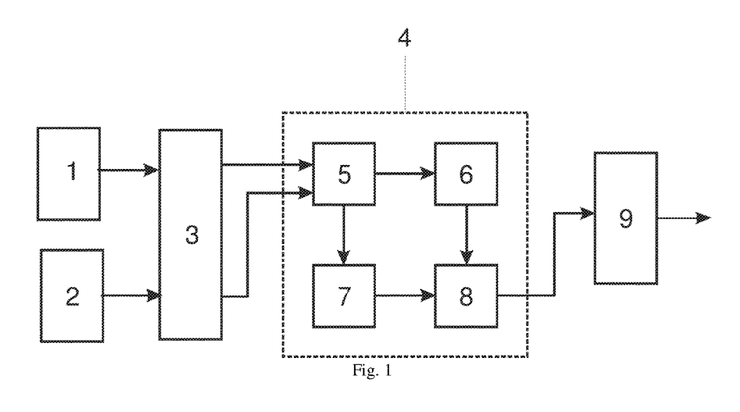
FIG. 1. Schematic diagram of the stated digital-analog system.

Analog-digital system for measuring physical quantity, comprise of the first measurement instrument 1 and the second measurement instrument 2, the analog-digital signal transducer 3, the digital-analog signal transducer 9 and a computing instrument 4, which is executed in the form of four functional blocks 5-8, interconnected between each other as follows. Input of the block 5, designed to convert source data into coefficient analogues and unknowns in the Pauli quantum equation with the spinor component of the Stern-Gerlach experiment, solutions of these equations and computing the analogues of the spin number and its corresponding probability, is connected to the output of the analog-digital signal transducer. Output of the block 5 is connected to the inputs of blocks 6 and 7, designed to indicate on the reference scales analogues of the spin number and its probability respectively. The outputs of blocks 6 and 7 are connected to the input of block 8, designed for converting the analogues of the spin number and its corresponding probability into the desired, corrected measurement result of a physical quantity, and the output of block 8 is connected to the input of analog-digital transducer 9.

Implementation of the method on this device is carried out as follows.

The signals from the measurement instruments (hereinafter—MI) 1 and 2 enter the analog-digital transducer 3, from the outputs of which, already in digital form, they are fed to the inputs of the functional block 5 the computing instrument 4.

Mathematically, the problem solved by the first block 5, can be represented as the calculation of a limited set of spin manifold numbers $\{\bar{S}\}=\{S_1, \ldots, S_i, \ldots, S_n\}$, $i=1, \ldots, n$ and corresponding probabilities to them $\{\bar{P}\}=\{P_1|S_1, \ldots, P_i|S_i, \ldots, P_n|S_n\}$, $i=1, \ldots, n$ based on measurement results of the first MI ($x_0$), of the second MI ($y_0$), as well as the attributed to them relative expanded uncertainties (errors) dx and dy, respectively.

To solve this task first a conversion is conducted of source data into coefficient analogues and unknowns in Pauli quantum equation with the spinor component of the Stern-Gerlach experiment as follows.

We restrict the dimension of coordinates of Pauli quantum equation with a two-dimensional coordinate system in accordance with the source data of the measurement task, which considers the two MI. Based on the analysis of the dimension of the variables Pauli quantum equation and the source data x0, y0, dx, dy measurement task to increase the accuracy of two MI, for the first MI, to which the result of the measurement x0 corresponds and attributed the relative expanded uncertainty (error), expressed as a percentage dx a substitution table is obtained presented below.

TABLE 1

Substitution table of variables of Pauli quantum equation and the source data of the measurement task for an equation, corresponding to the first MI

| variables of Pauli source quantum equation | | Variables of an analogue of Pauli equation based on the of source data of the measurement task | |
|---|---|---|---|
| Designation | Description | Formula | Appendix |
| β | Momentum operator | $\dfrac{1}{3dx\sqrt{2\pi}} e^{-\left(\sqrt{\frac{s^2-y_0^2-x_0^2+\frac{(x_0+y_0)^2}{2}}{2}+\frac{(x_0+y_0)}{2}-\frac{dx^2 y_0+dy^2 x_0}{dx^2+dy^2}}\right) \Big/ (18dx^2+const)}$ | Const - constant with the dimension of value x is equal to 1 |
| $\hbar$ | Planck's constant | $\pi/2$ | Dimensionless constant |
| e | Electron charge | $\bar{e}$ (see Table 2) | Dimensionless constant that depends on dx, dy |
| m | Mass | $2 + x_0 + dx/100$ | |
| A | Electric field potential | $\dfrac{\left(\dfrac{dx^2 y_0 + dy^2 x_0}{dx^2 + dy^2}\right)^2}{0.27 dx^2 \sqrt{2\pi}}$ | |
| φ | Magnetic field potential | $\dfrac{\dfrac{dx^2 y_0 + dy^2 x_0}{dx^2 + dy^2}}{2 * x_0 * \dfrac{dx}{100} * 2 * y_0 * \dfrac{dy}{100}}$ | |
| t | Time | $\tilde{t}$ | Arbitrary quantity, which has the dimension of time is the same for the source data dx, dy, x0, y0 of one measurement task |

TABLE 1-continued

Substitution table of variables of Pauli quantum equation and the source data of the measurement task for an equation, corresponding to the first MI

| variables of Pauli source quantum equation | | Variables of an analogue of Pauli equation based on the of source data of the measurement task | |
|---|---|---|---|
| Designation | Description | Formula | Appendix |
| B | Vector intensity of the magnetic field | $\left( dx\left( \frac{2*dx*dy*const^3}{x_0*y_0} - x_0 \right); \right.$ $\left. dy\left( \frac{2*dx*dy*const^3}{x_0*y_0} - y_0 \right) \right)$ | Const - constant with the dimension of value x is equal to 1 |
| $\hat{s} \cdot B$ | The product of the spin operator on the vector B | $\overline{S} \cdot B$ | The product of spin manifold on vector B |
| $y = e/2\,mc$ | The spin gyromagnetic ratio E | C (see Table 2) | Dimensionless constant that depends on dx, dy, $x_0$, $y_0$ |

Hereinafter in the formulae the normalizing coefficients equal to 1 will not be listed for brevity.

The substitution table of variables of Pauli quantum equation and the source data of the measurement task for the equation, corresponding to the second MI, with the measurement result y0 and attributed of the relative expanded uncertainty (error), expressed as a percentage dy is obtained by a simple change of variables $x_0 \rightarrow y_0$, $dx \rightarrow dy$.

The value of the dimensionless constants, corresponding in the substitution table of variables of Pauli quantum equation, the electron charge e and spin gyromagnetic ratio g are presented in Table. 2. The data in Table 2 were obtained based on the analysis of the dimension of the variables of Pauli quantum equation and the source data of the measurement task and on the basis of the conditions of a single normalization of the squared absolute value of the wave function for the first and second MI.

TABLE 2

The value of the dimensionless constants, corresponding in the substitution table of variables of quantum equation

| Variables of Pauli quantum equation | | Value of the dimensionless constants | | | | | |
|---|---|---|---|---|---|---|---|
| Designation | Description | Formula | | | | | Appendix |
| | | | dx/dy | | | | |
| | | $\tilde{e}$ | 0.25 | 0.5 | 0.75 | 1 | |
| e | Electron charge | Value of the constant | 0.984 | 0.635 | 0.86 | 0.3846 | |
| | | C Value of the constant | | dx/dy | | | |
| | | $x_0/y_0$ | 0.25 | 0.5 | 0.75 | 1 | |
| $g = \overline{2}$ | Spin gyromagnetic ratio | 0.25 | 1 | 0.9743 | 0.008371 | 0.58352 | For the equation corresponding to the first MI |
| | | 0.5 | 0.74245 | 0.27491 | 0.00004 | 0.003813 | |
| | | 0.75 | 0.62893 | 0.46274 | 0.28134 | 0.079367 | |
| | | 1 | 0.529346 | 0.43727 | 0.473923 | 0.402734 | |

TABLE 2-continued

The value of the dimensionless constants, corresponding in the substitution table of variables of quantum equation

| Variables of Pauli quantum equation | | Value of the dimensionless constants | | | | | |
|---|---|---|---|---|---|---|---|
| Designation | Description | Formula | | | | | Appendix |
| | | C Value of the constant | dy/dx | | | | |
| | | $x_0/y_0$ | 0.25 | 0.5 | 0.75 | 1 | |
| $g = \overline{2}$ | Spin gyromagnetic ratio | 0.25 | 0.72947 | 0.000374 | 0.23664 | 0.97364 | For the equation corresponding to the second MI |
| | | 0.5 | 0.45724 | 0.02743 | 0.34269 | 0.876392 | |
| | | 0.75 | 0.372487 | 0.476634 | 0.765437 | 0.70362 | |
| | | 1 | 0.529346 | 0.43727 | 0.473923 | 0.402734 | |

As can be seen from Table 2, the value of the spin gyromagnetic ratio g is different for the equation, corresponding to the first and second MI. Intermediate values of dimensionless constants, apart those that are indicated in Table 2 may be obtained either by rounding off to the nearest values, or by using known interpolation methods.

The set of spin numbers $\{\overline{S}\}=\{S_1, \ldots, S_i, \ldots, S_n\}$, $i=1, \ldots, n$ and corresponding to them probabilities $\{\overline{P}\}=\{P_1|S_1, \ldots, P_i|S_i, \ldots, P_n|S_n\}$, $i=1, \ldots, n$ are simultaneously the variables of the initial Pauli quantum equation and its corrected counterpart variables. At that in the initial Pauli quantum equation, there are two parameters which are out of dimensional analysis associated with quantum parameters: a set of spin numbers $\{\overline{S}\}$ and corresponding to them probabilities $\{\overline{P}\}$ in the corrected analogue of Pauli quantum equation (see Table 3).

TABLE 3

Substitution table of variables of the initial Pauli quantum equation and the quantum variables of the analogue, corrected by the dimension in accordance with the conditions of the measurement tasks of the equation

| Variables of the initial Pauli quantum equation | | Quantum variables of the corrected analogue of Pauli equation | |
|---|---|---|---|
| Designation | Description | Type of change | Description |
| $\{\overline{X}\} = \{x_1, x_2\}$ | Coordinate of the particle in the corresponding dimension | $s \leftrightarrow \sqrt{x_1^2 + x_2^2}$ | Spin |
| $|\psi|^2 (\overline{X}, t)$ | The squared absolute value of the wave function of the particle coordinates | $|\psi|^2 (S_i, \overline{t}) = P_i|S_i$ | The squared absolute value of the wave function of the spin |

Next, in block 5 the solution of the equations and computed analogues of the spin number and its corresponding probability is conducted as follows.

Consider the Pauli equation.

$$i\tilde{z}\frac{\partial \psi(\overline{X}, t)}{\partial t} = \left[\frac{1}{2m}\left(\hat{p} - \frac{e}{c}A\hat{I}\right)^2 + e\hat{I}\varphi - g \cdot \hbar(\sigma B)\right]\psi(\overline{X}, t) \quad (1)$$

Where $\hat{I}$ is the unit operator.
Opening the operator σ in (1) we obtain $$i\tilde{z}\frac{\partial \psi(\overline{X}, t)}{\partial t} = \left[\frac{1}{2m}\left(\hat{p} - \frac{e}{c}A\hat{I}\right)^2 + e\hat{I}\varphi - \frac{g \cdot \hbar}{2}(\hat{s} \cdot B)\right]\psi(\overline{X}, t) \quad (2)$$

Using the substitution table of variables of Pauli quantum equation and the source data of the measurement task (Table 1) and the substitution table of variables of the initial Pauli quantum equation and the analogue of the quantum variables (Table 3), we obtain, the corrected by dimension in accordance with the conditions of the measurement task the analogue of Pauli equation (3), corresponding to the first MI.

$$i\frac{\pi}{2}\frac{\partial \psi(\overline{S}, t)}{\partial t} = \quad (3)$$

-continued $$\left[\left|\frac{1}{2*x_0*\frac{dx}{100}(dx^2+dy^2)|x_0-y_0|}\right|\left(\frac{1}{0.03*dx\sqrt{2\pi}}\exp\left(-\frac{\left(\sqrt{\frac{s^2-y_0^2-x_0^2+\frac{(x_0+y_0)^2}{2}}{2}}+\frac{x_0+y_0}{2}-\frac{dx^2y_0+dy^2x_0}{dx^2+dy^2}\right)}{18dx^2}\right)\right.\right.-$$

$$\left.\left.2*x_0*\frac{dx}{100}*\frac{\frac{dx^2y_0+dy^2x_0}{dx^2+dy^2}}{2.7\cdot 10^{-7}\cdot dx^3\sqrt{2\pi}}C\right)^2+\tilde{e}\hat{I}\frac{\frac{dx^2y_0+dy^2x_0}{dx^2+dy^2}}{2*x_0*\frac{dx}{100}*2*y_0\frac{dy}{100}}\right]-$$

$$s*C*\sqrt{\frac{s^2-y_0^2-x_0^2+\frac{(x_0+y_0)^2}{2}}{2}}+\frac{x_0+y_0}{2}-\frac{dx^2y_0+dy^2x_0}{dx^2+dy^2}\left(\frac{dx\left(\frac{2*dx*dy}{x_0*y_0}-x_0\right)}{dy\left(\frac{2*dx*dy}{x_0*y_0}-y_0\right)}\right)\right]\psi(\bar{S},t)$$

The wave function in this equation after the substitution of variables in accordance with table 3 does not depend on the coordinates, but on the spin value, wherein the squared absolute value of the wave function is equal to the given spin probability.

The direction of the spin vector in the system analogue of the quantum system has a fixed angle value relative to the direction of the magnetic field analogue. These values πk/3, where k—natural number. Accordingly, for fixed input data the values of the projection of the spin vector are divided into a group of multiple integer values or a group of the value divided in half. These groups are analogues to the separation of bosons and fermions for spin. At that in the equation (2) there is a possibility of a virtual analogue 0-boson appearing (Higgs boson).

Time in the quantum analogue of equation (2) is a value equal to the source data $x_0$, $y_0$, dx, dy of one measurement task. For the next measurement task a second time point appears, and so on.

An example of implementation in block 5 of mathematical functions in the form of an algorithm shown in FIG. 2, as well as in the form of the program below.

An example of the use of the algorithm in the calculation program, written in the C programming language.

```
#include<stdio.h>
#include<math.h>
#define C(i,j) c[(i-1)*(N-1)+j-1]
#define D(i,j) d[(i-1)*(N-1)+j-1]
#define F(i,j) f[(i)*(N-1)+j-1]
#define Y(i,j) y[(i)*(N-1)+j-1]
#define Q(i,j) q[(i-1)*(N-1)+j-1]
#define P(i,j) p[(i-1)*(N-1)+j-1]
#define V(i,j) v[(i-1)*(N-1)+j-1]
double c1=0.57384
double c2=0.27482
#include"1.h"
void main( )
{double id=10,x0=0.5,z,dz, fi;
int i=0,j,n=5, s;
setlocale(0," ");
FILE *fout,*fin;
fout=fopen("out.txt","w");
fin=fopen("in.txt","r");
fscanf(fin,"%lf",&x);
fscanf(fin,"%lf",&dx);
fscanf(fin,"%lf",&y);
fscanf(fin,"%lf",&dy);
solvpaul(x, y, dx, dy, &fi, &s); //beginning of block 5
funcalg(x, y, dx, dy, fi, s, &z);// beginning of block 8
fprintf(fout,"%lf \n",z);
}
double h = 0;
int N;
int n;
```

```
//Right member of the Pauli equation (used in the calculation of block 5)
double ff(int i,int j,dx,dy,x,y)
{
    double a = double(i)*h;
    double b = double(j)*h;
    return (1/(2*x*dx*(dx*dx+dy*dy)*abs(x-y)))*((1/(0.03*dx*sqrt(2*3.14)))*exp(-
(sqrt((a*a-y*y-x*x+(x+y)*(x+y)/2)/2+(x+y)/2-
(x*dx*dx+y*dy*dy)/(dx*dx+dy*dy)))/(18*dx*dx)-
2*x*dx*((x*dx*dx+y*dy*dy)/(dx*dx+dy*dy)*c 1)/(2.7*Pow(10,-
7)*dx*dx*dx*sqrt(2*3.14))*((1/(0.03*dx*sqrt(2*3.14)))*exp(-(sqrt((a*a-y*y-
x*x+(x+y)*(x+y)/2)/2+(x+y)/2-(x*dx*dx+y*dy*dy)/(dx*dx+dy*dy)))/(18*dx*dx)-
2*x*dx*((x*dx*dx+y*dy*dy)/(dx*dx+dy*dy)* c 1)/(2.7*Pow(10,-
7)*dx*dx*dx*sqrt(2*3.14))+(x*dx*dx+y*dy*dy)/((dx*dx+dy*dy)*(4*dx*x*dy*y))-a*c2*-
(sqrt((a*a-y*y-x*x+(x+y)*(x+y)/2)/2+(x+y)/2-
(x*dx*dx+y*dy*dy)/(dx*dx+dy*dy)))*dx*((2*dx*dy)/(x*y)-x));
}
double g(int i,int j)
{
    double x =double(i)*h;
    double y =double(j)*h;
    return (1/(2*x*dx*(dx*dx+dy*dy)*abs(x-y)))*((1/(0.03*dx*sqrt(2*3.14)))*exp(-
(sqrt((a*a-y*y-x*x+(x+y)*(x+y)/2)/2+(x+y)/2-
(x*dx*dx+y*dy*dy)/(dx*dx+dy*dy)))/(18*dx*dx)-
2*x*dx*((x*dx*dx+y*dy*dy)/(dx*dx+dy*dy)*c1)/(2.7*Pow(10,-
7)*dx*dx*dx*sqrt(2*3.14))*((1/(0.03*dx*sqrt(2*3.14)))*exp(-(sqrt((a*a-y*y-
x*x+(x+y)*(x+y)/2)/2+(x+y)/2-(x*dx*dx+y*dy*dy)/(dx*dx+dy*dy)))/(18*dx*dx)-
2*x*dx*((x*dx*dx+y*dy*dy)/(dx*dx+dy*dy)*c2)/(2.7*Pow(10,-
7)*dx*dx*dx*sqrt(2*3.14))+(x*dx*dx+y*dy*dy)/((dx*dx+dy*dy)*(4*dx*x*dy*y))-a*c1*-
(sqrt((a*a-y*y-x*x+(x+y)*(x+y)/2)/2+(x+y)/2-
(x*dx*dx+y*dy*dy)/(dx*dx+dy*dy)))*dx*((2*dx*dy)/(x*y)-x))*sin(b);
}
// matrix for solving equations
void fill_c(double*c)
{
    for (int j = 1; j < N; j++)
        for (int i = 1; i < N; i++) C(i,j) = 0;
    for (int i = 1; i < N; i++) C(i,i) = 4;
    for (int i = 1; i < N-1; i++) C(i,i+1) = -1;
    for (int i = 2; i < N; i++) C(i,i-1) = -1;
}
void fill_cl(double *c, int k, int l)
{
    for (int j = 1; j < N; j++)
        for (int i = 1; i < N; i++) C(i,j) = 0;
    for (int i = 1; i < N; i++) C(i,i) = 4 -2.0*cos(double(2*1-1)*3.1415926/double(1<<k));
    for (int i = 1; i < N-1; i++) C(i,i+1) = -1;
    for (int i = 2; i < N; i++) C(i,i-1) = -1;
}
int InvMatrix(int size, double *a, double *x);
int solvpaul(double x,double y, double dx, double dy, double &z, int &s)//Solution of the
analogue Pauli equation(block 5)
{ h = 1.0/double(100);
N=100;
    double *vv = new double[N-1];
    double *f;double *c;double *d;double *q;double *v;double *p;double *y;
    int W=(N-1)*(N-1);
    int WE=(N+1)*(N-1);
    c = new double[W];d = new double[W];f = new double[WE];
    q = new double[W];p = new double[W];v = new double[W];
    y = new double[WE];
    fill_c(c);
    for (int i = 1; i < N; i++) F(0,i) = g(0,i);
    for (int i = 1; i < N; i++) F(N,i) = g(N,i);
        for (int j = 1; j < N; j++)
        {
    for (int i =1; i < N; i++)
    {
        F(j,i) = ff(i,j)*h*h;
    }
            F(j,1) += g(j,0);
            F(j,N-1) += g(j,N);
        }
    for (int j = 1; j < N; j++)
        for (int i = 1; i < N; i++)
        {
            Q(j,i) = F(j,i);
        }
    for (int j = 1; j < N; j++)
        for (int i = 1; i < N; i++) P(j,i)=0.0;
```

```
InvMatrix(N-1,c,d);
for (int j = 2; j <= N-2; j+= 2)
{
   for (int i = 1; i < N; i++)
   {
      P(j,i) = 0;
      for (int s = 1; s < N; s++) P(j,i) += D(i,s)*Q(j,s);
   }
}
for (int j = 2; j <= N-2; j+= 2)
{
   for (int i = 1; i < N; i++)
      Q(j,i) = 2.0*P(j,i) + Q(j-1,i)+Q(j+1,i);
}
for (int k = 2; k < n;k++)
{
   int t = 1<<k;
   int m = 1<<(k-1);
   for (int j= t; j <= N-t; j+= t)
   {
      for (int i = 1; i < N; i++)
         V(j,i) = Q(j,i) + P(j-m,i)+P(j+m,i);
   }
   for (int l= 1; l <= m; l++)
   {
      fill_cl(c,k,l);
      InvMatrix(N-1,c,d);
      for (int j= t; j <= N-t; j+= t)
      {
         for (int i = 1; i < N; i++)
         {
            double r = 0;
            for (int s = 1; s < N; s++) r += D(i,s)*V(j,s);
            vv[i-1] = r;
         }
         for (int i = 1; i < N; i++) V(j,i) = vv[i-1];
      }
   }
   for (int j= t; j <= N-t; j+= t)
   {
      for (int i = 1; i < N; i++)
         P(j,i) = P(j,i) + V(j, i);
      for (int i = 1; i < N; i++)
         Q(j,i) = 2.0*P(j,i) + Q(j-m, i)+Q(j+m,i);
   }
}
for (int i = 1; i < N; i++)
{
   Y(0,i) = F(0,i);
   Y(N,i) = F(N,i);
}
for (int k = n; k >= 2; k--)
{
   int m = 1 << (k-1);
   int t = 1 << k;
   for (int j = m; j <= N-m; j += 2*m)
   {
      for (int i = 1; i < N; i++)
         V(j,i) = Q(j,i) + Y(j-m,i) + Y(j+m,i);
   }
   for (int l = 1; l <= m; l++)
   {
      fill_cl(c,k,l);
      InvMatrix(N-1,c,d);
      for (int j= m; j <= N-m; j+= 2*m)
      {
         for (int i = 1; i < N; i++)
         {
            double r = 0;
            for (int s = 1; s < N; s++) r += D(i,$)*V(j,$);
            vv[i-1] = r;
         }
         for (int i = 1; i < N; i++) V(j,i) = vv[i-1];
      }
   }
   for (int j= m; j <= N-m; j+= 2*m)
   {
      for (int i = 1; i < N; i++) Y(j,i) = P(j,i) + V(j,i);
   }
```

```
}
fill_c(c);
InvMatrix(N-1,c,d);
    for (int j = 1; j <= N-1; j += 2)
    {
for (int i =1; i < N; i++)
{
    double r = 0;
    for (int s = 1; s < N; s++)
      r += (D(i,$))*(Q(j,$)+Y(j -1 ,$)+Y(j+1, s));
    vv[i-1] = r;
}
         for (int i = 1; i < N; i++) Y(j,i) = vv[i-1];
}
for (int j = 1; j < N-1; j++)
{
         for (int i = 1; i < N-1; i++)
         {
    if(Y[i,j]=Y[j,i])
            {z=%Y[i,j];
             s=round(2*i/12.375)/2.;
            }
    }
}
    delete c; delete d; delete f; delete q; delete p; delete v; delete y;
        delete vv;
    return 0;
}// End of computing of block 5. At the output of block 5 we obtain the values of z and s,
as
the values of the probability function and the spin value, respectively.
#define mItem(a, i, j) a[(i) * size + j]
int InvMatrix(int size, double *a, double *x)// Function to find the inverse matrix
{
    int i, j, k;
    double p;
    for (i = 0; i < size; i++)
        for (j = 0; j < size; j++)
            mItem(x, i, j) = (i = = j);
    /* Gauss forward move */
    for (i = 0; i < size; i++)
    {
        if (fabs(p = mItem(a, i, i)) < 1e-100)
            return 0;
        for (k = 0; k < size; k++)
        {
            mItem(a, i, k) /= p;
            mItem(x, i, k) /= p;
        }
        for (j = i + 1; j<size; j++)
        {
            p = mItem(a, j, i);
            for (k = 0; k < size; k++)
            {
              mItem(a, j, k) -= p * mItem(a, i, k);
              mItem(x, j, k) -= p * mItem(x, i, k);
            }
        }
    }
    for (k = 0; k < size; k++)
        for (i = size - 1; i >= 0; i--)
        {
            p = mItem(x, i, k);
            for (j = i + 1; j < size; j++)
              p -= mItem(x, j, k) * mItem(a, i, j);
            mItem(x, i, k) = p/mItem(a, i, i);
        }
    return 1;
}
double max(double x,double y){
    if(x>y)return x;
    return y;
}
double min(double x,double y) {if(x<y)return x;
return y;}
int funcalg(double x, double y, double dx, double dy, double fi, double s, double *z0)
{double o1, o2, q,l=d1[1]/(1+(d2[1]*1.)/100),r=d1[1]/(1-(d2[1]*1.)/100),x0=x,dx0=x*dx;
int nnn, i;
dx=dx/100;dy=dy/100;
if(dy*y>dx*x)
{dx0=y*dy;
```

```
x0=dy; }
l=max(y/(1+dy*1.),x/(1+dx*1.));
r=min(x/(1-dx*1.),x/(1-dx*1.));
o1=(r-l)/2;
o2=x+y;
o2/=n;
if(l>r)
{return 0;
}
else
{
if((x0-((o2+o1)*1.)/2)>=0)
{
*z0=(l+min(x0,r))*1./2;
return 1;
}
else
{
*z0=(r+max(x0,l))/2
return 1;
}
}
}
```

Using the source data of one measurement task $x_0$, $y_0$, $dx$, $dy$, we get two different analogue of the Pauli equation for two MI. Formula (4) represents an equation of the first MI formula (5), the equation for the second MI.

$$i\frac{\pi}{2}\frac{\partial \psi(\overline{S},t)_1}{\partial t} = \left[\frac{1}{2*x_0*\frac{dx}{100}}\left(\frac{1}{0.03*dx\sqrt{2\pi}}\exp\left(-\frac{\left(\sqrt{\frac{s^2-y_0^2-x_0^2+\frac{(x_0+y_0)^2}{2}}{2}}+\frac{x_0+y_0}{2}-\frac{dx^2y_0+dy^2x_0}{dx^2+dy^2}\right)^2}{18dx^2}\right)-\right.\right.$$

$$\left.2*x_0*\frac{dx}{100}*\frac{\frac{dx^2y_0+dy^2x_0}{dx^2+dy^2}}{2.7\cdot10^{-7}dx^3\sqrt{2\pi}}C_1\right)^2 + \hat{e}\hat{i}\frac{\frac{dx^2y_0+dy^2x_0}{dx^2+dy^2}}{2*x_0*\frac{dx}{100}*2*y_0*\frac{dy}{100}} -$$

$$\left.s*C_1*\sqrt{\frac{s^2-y_0^2-x_0^2+\frac{(x_0+y_0)^2}{2}}{2}}+\frac{x_0+y_0}{2}-\frac{dx^2y_0+dy^2x_0}{dx^2+dy^2}\left(\begin{matrix}dx\left(\frac{2*dx*dy}{x_0*y_0}-x_0\right)\\dy\left(\frac{2*dx*dy}{x_0*y_0}-y_0\right)\end{matrix}\right)\right]\psi_1(\overline{S},t) \quad (4)$$

$$i\frac{\pi}{2}\frac{\partial \psi(\overline{S},t)_2}{\partial t} = \left[\frac{1}{2*y_0*\frac{dx}{100}}\left(\frac{1}{0.03*dy\sqrt{2\pi}}\exp\left(-\frac{\left(\sqrt{\frac{s^2-y_0^2-x_0^2+\frac{(x_0+y_0)^2}{2}}{2}}+\frac{x_0+y_0}{2}-\frac{dx^2y_0+dy^2x_0}{dx^2+dy^2}\right)^2}{18dy^2}\right)-\right.\right.$$

$$\left.2*y_0*\frac{dy}{100}*\frac{\frac{dx^2y_0+dy^2x_0}{dx^2+dy^2}}{2.7\cdot10^{-7}dy^3\sqrt{2\pi}}C_2\right)^2 + \hat{e}\hat{i}\frac{\frac{dx^2y_0+dy^2x_0}{dx^2+dy^2}}{2*x_0*\frac{dx}{100}*2*y_0*\frac{dy}{100}} -$$

$$\left.s*C_2*\sqrt{\frac{s^2-y_0^2-x_0^2+\frac{(x_0+y_0)^2}{2}}{2}}+\frac{x_0+y_0}{2}-\frac{dx^2y_0+dy^2x_0}{dx^2+dy^2}\left(\begin{matrix}dy\left(\frac{2*dx*dy}{x_0*y_0}-y_0\right)\\dx\left(\frac{2*dx*dy}{x_0*y_0}-x_0\right)\end{matrix}\right)\right]\psi_2(\overline{S},t) \quad (5)$$

Analogue of the mass in the quantum equation, which in the substitution table (Table 1) is expressed for the first MI $2*x_0*dx/100$ and for the second MI $2*y_0*dy/100$ serves the purpose of normalization of the squared absolute value of the wave function for the first MI $\psi_1(\overline{S}, t)$ and second MI $\psi_2(\overline{S}, t)$, which is necessary for their further correlation to the minimax criterion in solving the system equation (4, 5).

Coefficient C in Table. 2, as mentioned above, formed on the basis of the normalization of the squared absolute value of the wave function equations for different MI.

For simplicity we expand the equation (4, 5) on the imaginary and real parts. Then the system of equations for the real part is as follows:

$$-\frac{\pi}{2}\frac{\partial|\psi(\overline{S},t)_1|*\mathrm{sinarg}\psi(\overline{S},t)_1}{\partial t} = \tag{6}$$

$$\left[\left|\frac{1}{2*x_0*\frac{dx}{100}}\left(\frac{1}{0.03*dx\sqrt{2\pi}}\exp\left(-\frac{\left(\sqrt{\frac{s^2-y_0^2-x_0^2+\frac{(x_0+y_0)^2}{2}}{2}}+\frac{x_0+y_0}{2}-\frac{dx^2 y_0+dy^2 x_0}{dx^2+dy^2}\right)}{18dx^2}\right)\right.\right.\right.-$$

$$\left.\left.\left.2*x_0*\frac{dx}{100}*\frac{\frac{dx^2 y_0+dy^2 x_0}{dx^2+dy^2}}{2.7\cdot 10^{-7}dx^3\sqrt{2\pi}}C_1\right)^2+\tilde{e}\hat{\imath}\frac{\frac{dx^2 y_0+dy^2 x_0}{dx^2+dy^2}}{2*x_0*\frac{dx}{100}*2*y_0*\frac{dy}{100}}-s*C_1*\sqrt{\frac{s^2-y_0^2-x_0^2+\frac{(x_0+y_0)^2}{2}}{2}}+\right.\right.$$

$$\left.\left.\frac{x_0+y_0}{2}-\frac{dx^2 y_0+dy^2 x_0}{dx^2+dy^2}\left(\frac{dx\left(\frac{2*dx*dy}{x_0*y_0}-x_0\right)}{dy\left(\frac{2*dx*dy}{x_0*y_0}-y_0\right)}\right)\right]\right]|\psi_1(\overline{S},t)|*\mathrm{cosarg}\psi(\overline{S},t)_1-\frac{\pi}{2}\frac{\partial|\psi(\overline{S},t)_2|*\mathrm{sinarg}\psi(\overline{S},t)_2}{\partial t}=$$

$$\left[\left|\frac{1}{2*y_0*\frac{dy}{100}}\left(\frac{1}{0.03*dy\sqrt{2\pi}}\exp\left(-\frac{\left(\sqrt{\frac{s^2-y_0^2-x_0^2+\frac{(x_0+y_0)^2}{2}}{2}}+\frac{x_0+y_0}{2}-\frac{dx^2 y_0+dy^2 x_0}{dx^2+dy^2}\right)}{18dy^2}\right)\right.\right.\right.-$$

$$\left.\left.\left.2*y_0*\frac{dy}{100}*\frac{\frac{dx^2 y_0+dy^2 x_0}{dx_2+dy^2}}{2.7\cdot 10^{-7}dy^3\sqrt{2\pi}}C_2\right)^2+\tilde{e}\hat{\imath}\frac{\frac{dx^2 y_0+dy^2 x_0}{dx^2+dy^2}}{2*x_0*\frac{dx}{100}*2*y_0*\frac{dy}{100}}-s*C_2*\right.\right.$$

$$\left.\left.\sqrt{\frac{s^2-y_0^2-x_0^2+\frac{(x_0+y_0)^2}{2}}{2}}+\frac{x_0+y_0}{2}-\frac{dx^2 y_0+dy^2 x_0}{dx^2+dy^2}\left(\frac{dy\left(\frac{2*dx*dy}{x_0*y_0}-y_0\right)}{dx\left(\frac{2*dx*dy}{x_0*y_0}-x_0\right)}\right)\right]\right]|\psi(\overline{S},t)_2|*\mathrm{cosarg}\psi(\overline{S},t)_2$$

And from the imaginary part of the equation, we obtain the following system:

$$\frac{\pi}{2}\frac{\partial|\psi(\overline{S},t)_1|*\mathrm{cosarg}\psi}{\partial t}= \tag{7}$$

$$\left[\left|\frac{1}{2*x_0*\frac{dx}{100}}\left(\frac{1}{0.03*dx\sqrt{2\pi}}\exp\left(-\frac{\left(\sqrt{\frac{s^2-y_0^2-x_0^2+\frac{(x_0+y_0)^2}{2}}{2}}+\frac{x_0+y_0}{2}-\frac{dx^2 y_0+dy^2 x_0}{dx^2+dy^2}\right)}{18dx^2}\right)\right.\right.\right.-$$

-continued $$2*x_0*\frac{dx}{100}*\frac{\frac{dx^2y_0+dy^2x_0}{dx_2+dy^2}}{2.7\cdot 10^{-7}dx^3\sqrt{2\pi}}C_1\Bigg)^2+\tilde{e}\hat{i}\frac{\frac{dx^2y_0+dy^2x_0}{dx^2+dy^2}}{2*x_0*\frac{dx}{100}*2*y_0*\frac{dy}{100}}-s*C_1*\sqrt{\frac{s^2-y_0^2-x_0^2+\frac{(x_0+y_0)^2}{2}}{2}}+$$

$$\frac{x_0+y_0}{2}-\frac{dx^2y_0+dy^2x_0}{dx^2+dy^2}\Bigg(\begin{array}{c}dx\Big(\frac{2*dx*dy}{x_0*y_0}-x_0\Big)\\dy\Big(\frac{2*dx*dy}{x_0*y_0}-y_0\Big)\end{array}\Bigg)\Bigg]|\psi_1(\overline{S},t)|*\sinarg\psi\frac{\pi}{2}\frac{\partial|\psi(\overline{S},t)_2|*\cosarg\psi(\overline{S},t)_2}{\partial t}=$$

$$\Bigg[\frac{1}{2*y_0*\frac{dy}{100}}\Bigg(\frac{1}{0.03*dy\sqrt{2\pi}}\exp\Bigg(-\frac{\Bigg(\sqrt{\frac{s^2-y_0^2-x_0^2+\frac{(x_0+y_0)^2}{2}}{2}}+\frac{x_0+y_0}{2}-\frac{dx^2y_0+dy^2x_0}{dx^2+dy^2}\Bigg)}{18dy^2}\Bigg)-$$

$$2*y_0*\frac{dy}{100}*\frac{\frac{dx^2y_0+dy^2x_0}{dx_2+dy^2}}{2.7\cdot 10^{-7}dy^3\sqrt{2\pi}}C_2\Bigg)^2+\tilde{e}\hat{i}\frac{\frac{dx^2y_0+dy^2x_0}{dx^2+dy^2}}{2*x_0*\frac{dx}{100}*2*y_0*\frac{dy}{100}}-s*C_2*$$

$$\sqrt{\frac{s^2-y_0^2-x_0^2+\frac{(x_0+y_0)^2}{2}}{2}}+\frac{x_0+y_0}{2}-\frac{dx^2y_0+dy^2x_0}{dx^2+dy^2}\Bigg(\begin{array}{c}dy\Big(\frac{2*dx*dy}{x_0*y_0}-y_0\Big)\\dx\Big(\frac{2*dx*dy}{x_0*y_0}-x_0\Big)\end{array}\Bigg)\Bigg]|\psi(\overline{S},t)_2|*\sinarg\psi(\overline{S},t)_2$$

In this expansion, we distinguish four equations for the wave function, which we will solve together, using the boundary conditions. In the solution we are interested in the real part of the wave functions.

To find the boundary conditions, note that for x=y the probability of estimation of the true value of the measured quantity tends to 1, and at the same time, we assume that such an estimate of the corresponding true value of the measured quantity the spin number will always be 0. This boundary condition is shown in equation $$|\psi(0,t_0)|=\frac{1}{0.03dx*x_0\sqrt{2\pi}}e^{-\frac{\left(\sqrt{x_0^2+y_0^2}\frac{dx^2y_0+dy^2x_0}{dx^2+dy^2}\right)}{18(dx*x_0*0.02)^2}} \quad (8)$$

We denote the coefficient $k=x_0/y_0$.

Then the boundary condition (6) is rewritten as (7) for the general case.

$$|\psi(0,t_0)|=\frac{e^{\frac{-k}{18(dx*x_0*0.02)^2}}}{0.03dx*x_0\sqrt{2\pi}}e^{-\frac{\left(\sqrt{x_0^2+y_0^2}\frac{dx^2y_0+dy^2x_0}{dx^2+dy^2}\right)}{18(dx*x_0*0.02)^2}} \quad (9)$$

In system of equations 6 and 7, there is uncertainty associated with the possible positive or negative direction of the spin. However, this uncertainty does not result in an ambiguity in the solution process, as the solution in the first equation and the second system equation should be not only with a single spin number, but also unidirectional to obtain one wave function.

Find the value of $S_{max}$ of intersection of the graphs of the squared absolute value of the wave function, is such that $$|\psi_{max}(S_{max},t_0)|^2=\underset{i}{\text{Max}}\{\Psi_i=|\psi_1(S_i,t_0)|^2=|\psi_2(S_i,t_0)|^2\}, \quad (10)$$

$$i=1,\ldots,n$$

The desired spin number S0, corresponding to the estimate of the true value of the measured value is obtained by rounding off the value $S_{ax}$ to the nearest of the many of possible values of the spin (0, ½, 1, 3/2 . . . ). However the squared absolute value of the wave function remains the same, corresponding to the value $S_{max}|\psi_{max}(S_{max},t_0)|^2$.

After conducting in the unit 5 the above stated calculation, the computed values of the analogues of the spin numbers and its probability, from the outputs of block 5 are fed to the inputs of the blocks 6 and 7, in which indication is conducted of these values on the reference scales. The outputs of blocks 6 and 7 are connected to the inputs of block 8. In this block a task is solved, opposite of that in block 5: calculating the estimate of the true value of the measurement result (z) and its expanded uncertainty (error) (dz) on the basis of the source data on the maximum probability $$P_k \mid S_k = \underset{i=1,n}{\text{MAX}}\{P_i \mid S_i \in \{\overline{P}\}), гд е\ k \in \{1, \ldots, it\}$$

for a limited set of spin numbers {S}.

Mathematically, it is produced so.

To solve the inverse task—calculation of the estimate of the true value of the measurement result (z) and its expanded uncertainty (error) (dz) with the found value of the spin $S_0$—we use the quasiclassical approximation of the Schrodinger equation. In general, for the points where the energy of the particle is not equal to the field potential, the solution can be represented as follows:

$$\psi(x) = \frac{c}{\sqrt{p(x)}} e^{[\pm \frac{i}{\hbar} \int p dx]} \qquad (11)$$

Near the points where energy is equal to the potential of the field, the Schrodinger equation can be approximately replaced by the equation with a linear potential $U(x)=U'(x_0)(x-x_0)$, which reduces to the Airy equation. Its solution:

$$\psi(x) = K \sqrt{\frac{\xi}{p(x)}} Z_{\frac{1}{3}}(\xi) \qquad (12)$$

where $Z\frac{1}{3}(\xi)$—any solution of Bessel equation with an index ⅓ and $$\xi = \int_{y_1}^{y} p dx \qquad (13)$$

Consider the analogues of quantum equations with substitution of variables in accordance with Table. 1, dimensionless constants, taken in accordance with the Table. 2 and the change of variables in accordance with Table. 3.

If the value $$|x_0 - y_0| > \frac{1}{2} \min\left(\frac{2x_0 dx}{100}; \frac{2x_0 dx}{100}\right)$$

as the solutions of the Bessel equation we use $$\psi = \frac{z + \frac{x_0 + y_0}{4} * 0.6 + 0.4 * \frac{\min\left(\frac{y}{1 - dy*1.}, \frac{x}{1 - dx*1.}\right) - \max\left(\frac{y}{1 + dy*1.}, \frac{x}{1 + dx*1.}\right)}{4}}{\sqrt{\frac{1}{3dx\sqrt{2\pi}} e^{-\left(\sqrt{\frac{s^2 - y_0^2 - x_0^2 + \frac{(x_0+y_0)^2}{2}}{3}} + \frac{(x_0+y_0)}{2} - \frac{dx^2 y_0 + dy^2 x_0}{dx^2 + dy^2}\right)/18dx^2}}} \qquad (14)$$

in case $$|x_0 - y_0| \leq \frac{1}{2} \min\left(\frac{2x_0 dx}{100}; \frac{2x_0 dx}{100}\right)$$

$$\psi = \frac{z + \frac{x_0 + y_0}{4} * 0.6 + 0.4 * \frac{\min\left(\frac{y}{1 - dy*1.}, \frac{x}{1 - dx*1.}\right) - \max\left(\frac{y}{1 + dy*1.}, \frac{x}{1 + dx*1.}\right)}{4}}{\sqrt{\frac{1}{3dx\sqrt{2\pi}} e^{-\left(\sqrt{\frac{s^2 - y_0^2 - x_0^2 + \frac{(x_0+y_0)^2}{2}}{3}} + \frac{(x_0+y_0)}{2} - \frac{dx^2 y_0 + dy^2 x_0}{dx^2 + dy^2}\right)/18dx^2}}} \qquad (15)$$

Equate the squared absolute value of the modulus of this value to the previously calculated value of the probability function $|\psi_{max}(S_{max}, t_0)|^2$.

Solving the equation relatively z.

As a result, the obtained solution can be either between the source values x, y, and also deflected in one direction relative to both measurements, or even coincide with one of them. This corresponds to the theoretical and experimental data. The ideal value should pertain to the segment of intersection of the uncertainty interval. If the intersection intervals of the uncertainty—empty set, then the input data (x, y, dx, dy) is incorrect, measurement instruments are working incorrectly.

I.e., if the condition are realized $$\min(x0*(1+dx/100), y0*(1+dy/100)) < \max(x0*(1-dx/100), y0*(1-dy/100)), \qquad (16)$$

then the input data is not true, and the calculation will not be carried out.

If the value id does not pertain to the segment $$[\max(x0*(1-dx/100), y0*(1-dy/100)); \min(x0*(1+dx/100), y0*(1+dy/100))], \qquad (17)$$

then by the input data this would be impossible to determine, and the calculation will be carried out, but such a situation can occur only when measurement instruments are defected, as it corresponds to the falling of the id value out of the confidence interval.

After conducting the above stated calculations and the computation of the corrected measurement result of a physical quantity in block, this data is fed to the input of the transducer signal from the digital form to analog form 9, from the output of which the correct result in analog form is received.

Figure 2:
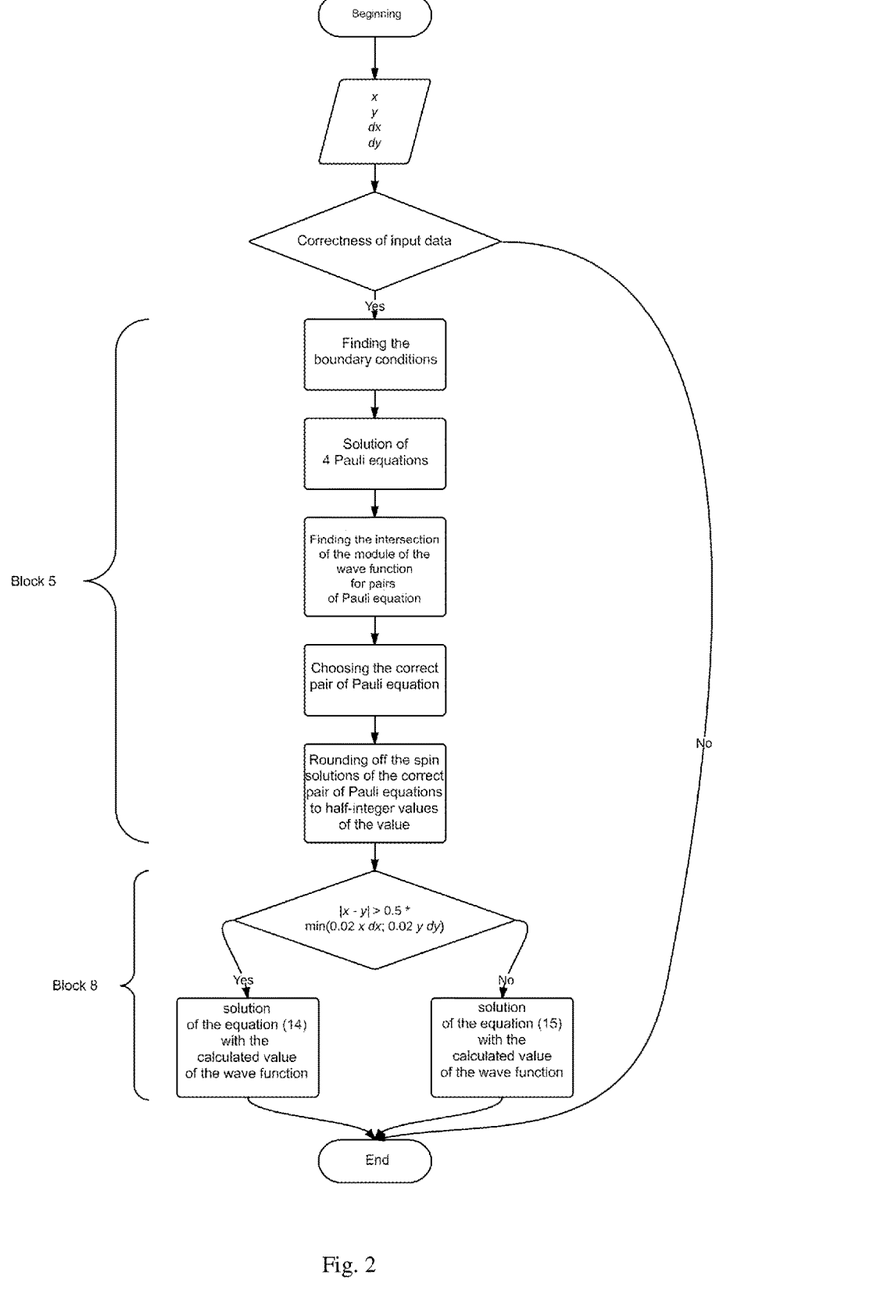
FIG. 2. Diagram of the algorithm solutions.

Example of the implemented mathematical functions of the algorithm in block 8 is shown in FIG. 2, and the program on pages 8-1.3.

The proposed method of measurement and the analog-digital system for its implementation have been tested in the measurement of excess pressure in a closed pipeline MI—primary measurement transducers of excess pressure with a standard 4-20 mA current output. As the first and second MI primary measurement transducers were used, calibrated to the output level signal of the current output set to 20 mA for the upper limit of measurement 630 kPa, and the lower 4 mA—for 126 kPa respectively.

The measurement result obtained by the first MI was equal to x=318.15 kPa, which corresponded to the output of the current output 10.10 mA, and the attributed to it the relative expanded uncertainty (error), expressed as a percentage, dx=1%. For the second MI the measurement result was y=315.00 kPa, and the output signal of the current output 10.00 mA and the expanded uncertainty (error), expressed as a percentage, dy=0.8%. To test the beneficial effects—the increased measurement accuracy of the implementation of the proposed method of measurement and analog-digital system for its implementation an excess pressure sensor was used as a reference standard to the upper limit of the measurement 630 kPa and reduced relative uncertainty (error), expressed as a percentage, dz=0.075%, the result of the measurement of excess pressure which was z=314.99 kPa, and the relative uncertainty (error) for the measured quantity, expressed as a percentage, dz=0.15%.

In general, the equation (3) is as follows $$\frac{\pi}{2} i \frac{\partial \psi_1(s,t)}{\partial t} = H_1 \psi_1(s,t)$$

$$\frac{\pi}{2} i \frac{\partial \psi_2(s,t)}{\partial t} = H_2 \psi_2(s,t)$$

Using the finite-difference approximation of the time derivative for the solution of the equation $$\psi_j^{n+1} = \frac{1 - i\frac{1}{2}H\Delta t}{1 + i\frac{1}{2}H\Delta t} \psi_j^n$$

Tridiagonal method of solving can be used.
We find $s_0$, which satisfies both equations, provided that $$\frac{|\psi_1(s_0, t_0)|}{2 * x_0 * \frac{dx}{100}} = \frac{|\psi_2(s_0, t_0)|}{2 * x_0 * \frac{dx}{100}}$$

With boundary conditions $$|\psi_1(0, t_0)| = \frac{e^{\frac{-k}{18(dx*x_0*0.02)^2}}}{0.03 * dx * x_0 \sqrt{2\pi}} e^{-\left(\sqrt{x_0^2+y_0^2} - \frac{dx^2 y_0 + dy^2 x_0}{dx^2+dy^2}\right) / 18(dx*x_0*0.02)^2} \approx 0$$

$$|\psi_2(0, t_0)| = \frac{e^{\frac{-k}{18(dy*y_0*0.02)^2}}}{0.03 * dy * y_0 \sqrt{2\pi}} e^{-\left(\sqrt{x_0^2+y_0^2} - \frac{dx^2 y_0 + dy^2 x_0}{dx^2+dy^2}\right) / 18(dy*y_0*0.02)^2} \approx 0$$

As a result, by method of numerical technique we obtain $|\psi_1(s,t_0)|=0.644724$.

We finds as a point of intersection. We obtain s=1.0962.

After rounding off s is equal to 1 and the probability of this is 0.41567.

The first part of the solution is over.

$$\|0,1-10|>\frac{1}{2}0.08$$

Equate the calculation of formula (10) to the solution of the Pauli equation, as found above the key value.

The result is a solution z=10.0018999 mA, to which the result of the measurement 315.06 kPa corresponds, which coincides with the expanded uncertainty of the sensor, taken as a reference standard with a reference value of 314.99 kPa. The best statistical estimate for averaging of data for the two experiments with regard for unequal accuracy of the first and second MI will be the weighted average, where as the weight the value of reciprocal expanded uncertainty (error) of the sensors will be used, which is calculated by formula.

$$Z = \frac{\frac{1}{dy} y_0 + \frac{1}{dx} x_0}{\frac{1}{dx} + \frac{1}{dy}}$$

the result is a value 9.088888.

Obviously, the result of testing the proposed measurement method, and the analog-digital system for its implementation showed a significant beneficial effect of improving the measurement accuracy by its implementation.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. An analog-digital system for conducting more precise measurements of a quantity of a parameter type, the analog-digital system comprising:
   a first measurement instrument,
   a second measurement instrument,
   at least one analog-digital transducer,
   at least one digital-analog transducer, and
   a computing instrument including four interconnected functional blocks,
      wherein the system is further arranged such that:
      at least one output of the first measurement instrument and the second measurement instrument are connected to plurality of inputs of the analog-digital transducer, wherein the analog-digital transducer converts data in an analog form into a digital form,
      plurality of outputs of the analog-digital transducer are connected to plurality of inputs of a first functional block of the computing instrument, wherein the first functional block converts source data into coefficient analogues and unknowns in Pauli quantum equation with a spinor component of Stern-Gerlach experiment to mathematically determine analogues of a spin number and its corresponding probability,
      at least one output of the first block is connected to at least one input of a second block and a third block,
      at least one output of the second block and the third block are connected to at least one input of a fourth block to convert the analogues of the spin number and its corresponding probability into a precise measurement result of the quantity of the parameter type, and
      at least one output of the fourth block is connected to at least one input of the digital-analog transducer, wherein the digital-analog transducer converts data in digital form into an analog form.

2. A method of conducting more precise measurements of a quantity of a parameter type, the method comprising the steps of:

providing a registry comprised of two measurement instruments for measuring values of the quantity in an analog form, measuring values of the quantity in the analog form by a first measurement instrument, converting the analog form obtained by the first measurement instrument into a digital form, measuring values of the quantity in the analog form by a second measurement instrument, converting the analog form obtained by the second measurement instrument into the digital form, setting an uncertainty rate based on the values in the digital form obtained by the two measurement instruments, mathematically processing a source data to obtain a result in the digital form, wherein the source data includes the digital form of the measured values obtained by the two measurement instruments and the uncertainty rate, wherein the mathematical processing is performed by converting the source data into coefficient analogues and unknowns in Pauli quantum equation with a spinor component of Stern-Gerlach experiment, and converting the result in the digital form back to the analog form.

\* \* \* \* \*